US005689218A

United States Patent [19]

Stein et al.

[11] Patent Number: 5,689,218

[45] Date of Patent: Nov. 18, 1997

[54] TAP FOR EXTRACTING ENERGY FROM TRANSMISSION LINES

[75] Inventors: Richard P. Stein, Princeton; Wesley R. Paxman, Richardson, both of Tex.

[73] Assignee: Andrew Corporation, Orland Park, Ill.

[21] Appl. No.: 595,362

[22] Filed: Feb. 1, 1996

[51] Int. Cl.[6] .......... H03H 7/38

[52] U.S. Cl. .......... 333/125; 333/27; 333/131

[58] Field of Search .......... 333/24 R, 24 C, 333/27, 32, 33, 100, 124, 125, 131, 136

[56] References Cited

U.S. PATENT DOCUMENTS

| | | | |
|---|---|---|---|
| 2,805,399 | 9/1957 | Leeper | 333/136 |
| 2,891,222 | 6/1959 | Freen | 333/124 |
| 3,299,384 | 1/1967 | Lee | 333/24 R |
| 3,881,160 | 4/1975 | Ross | 333/124 |
| 4,190,816 | 2/1980 | Moss et al. | 333/131 |
| 4,951,012 | 8/1990 | Oppelt et al. | 333/33 |
| 5,281,933 | 1/1994 | Chamberlin | 333/132 |

OTHER PUBLICATIONS

"Mixers in Microwave Systems," Bert Henderson, Microwave Systems News, Oct., 1989, pp. 4, 64–65. 68–69, 72–74.

"Mixers in Microwave Systems—Part II," Bert Henderson, Microwave Systems News, Nov. 1969, pp. 4, 71–75.

"Design of Broadband Passive Components With Ferrites," M. MacDonald, Microwaves & RF, Oct. 1993, pp. 81–86, 132.

"Some Broad–Band Transformers," C.L. Ruthroff, Proceedings of the IRE, vol. 47, Aug. 1959, pp. 1337–1342.

Chapter 5 of the Book by E.C. Snelling and A.D. Giles *Ferrites for Inducttors and Transformers*, Research Studies Press, 1983, pp. 103–153.

G. Guanella, "New Method of Impedance Matching in Radio–Frequency Circuits," *The Brown Boveri Review*, vol. 31, Sep. 1944, pp. 327–329.

Ersch Rotholz, "Transmission–Line Transformers, IEEE Transactions on Microwave Theory and Techniques", vol. MTT–29, No. 4, Apr. 1981, pp. 327–331.

Alex J. Burwasser, "Taking the Magic Out of the 'Magic Tree'" RF Design May/Jun. 1983, pp. 44–60.

*Primary Examiner*—Benny Lee

*Assistant Examiner*—Barbara Summons

[57] ABSTRACT

A tap for coupling electromagnetic energy between first and second coaxial cables. The tap comprises a pair of coupled transmission lines, means for connecting said transmission lines to said first cable, and means for connecting said transmission lines to said second cable.

25 Claims, 8 Drawing Sheets

TAP FOR EXTRACTING ENERGY FROM TRANSMISSION LINES

FIELD OF INVENTION

The present invention relates generally to taps which extract electromagnetic energy from transmission lines and specifically taps which extract electromagnetic energy from transmission lines and which couple the electromagnetic energy to other transmission lines.

SUMMARY OF THE INVENTION

It is an object of the invention to provide a method of cross-connecting segments of multifilar wire in a tap such that the tap has low losses and operates over broad bandwidths.

Another object of the invention is to provide an assembly for the tap that is inexpensive to manufacture, rugged in operation, and does not require a splice.

A further object of the invention is to provide a sequence of connections of the multifilar wire which allow couplings greater than 3 dB while maintaining the same or a wider bandwidth.

Another object of the invention is to provide a broadband input impedance for taps that allow their use with 30 to 150 ohm coaxial cable systems.

Still another object of the invention is to provide a tap that is not limited to attachment to single size of cable but can be attached to cables with varied diameters.

Yet another object of the invention is to provide a tap which operates at a certain frequency with a host cable but causes minimum interference with the host cable at other frequencies.

Another object of the invention is to provide a tap that generate very low intermodulation products.

Other aspects and advantages of the present invention will become apparent upon reading the following detailed description and upon reference to the drawings.

In accordance with the present invention, the foregoing objectives are realized by a tap for coupling electromagnetic energy between first and second coaxial cables. The tap comprises a pair of coupled transmission lines, means for connecting the transmission lines to the first cable, and means for connecting the transmission lines to the second cable.

DESCRIPTION OF THE EMBODIMENTS

Figure 1A:
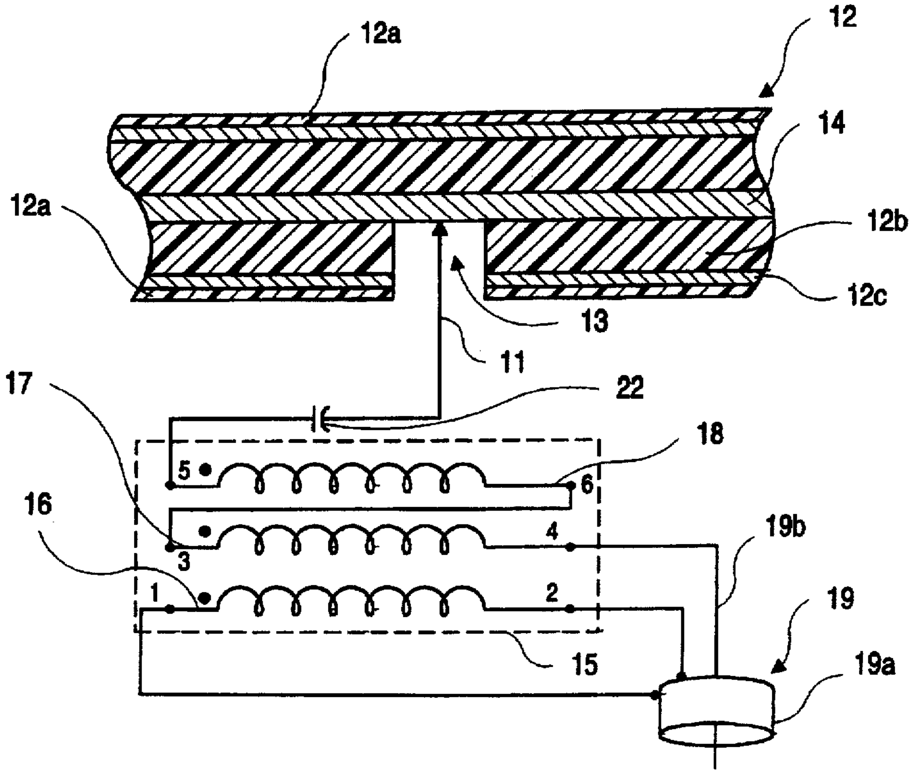
FIG. 1*a*is a schematic diagram of a tap according to the principles of the invention.

FIG. 1*a* shows a tap for coupling electromagnetic energy between coaxial cable transmission lines. Although coaxial transmission lines are shown, it will be understood that any kinds of transmission lines can be tapped by the invention. A hole 13 is drilled through the outer jacket 12*a*, outer conductor 12*c*, and dielectric 12*b* of a host coaxial feeder cable 12 to a central conductor 14. The hole 13 is drilled such that the hole exposes the central conductor 14. Penetration into the central conductor 14 when the hole is drilled is preferably minimal.

For the purpose of extracting electromagnetic energy from the central conductor 14 and conducting this energy into the tap, a probe 11 is placed in the hole 13. Preferably, the probe 11 is spring loaded to bias the probe into engagement with the central conductor 14. Insulating material, such as heat shrink tubing (not illustrated), can be placed over the probe 11 to prevent the probe 11 from contacting the outer conductor 12*c* of the host cable 12. The host cable can be any form of coaxial cable such as radiating or non-radiating coaxial cable.

In order to couple the extracted energy to the output of the tap, a coupler 15 is attached between the probe 11 and an output RF connector 19. According to the embodiment of FIG. 1*a*, the coupler 15 comprises a length of twisted trifilar wire. The coupler 15 then operates as a pair of transmission lines with a center frequency which is a function of the length of the twisted trifilar wire.

Specifically, a first wire 16 within the coupler 15 shields the tap by being connected to the connector shield 19*a* at ends 1 and 2. Wires 17 and 18 within coupler 15 comprise coupled transmission lines and are cross-connected to each other. End 5 of wire 18 is connected to an isolation capacitor 22 which is in turn connected to the output of probe 11. Alternatively, the capacitor may be omitted and end 5 may be connected directly to probe 11. End 6 of wire 18 is cross-coupled to end 3 of wire 17. End 4 of wire 17 is connected to the inner conductor 19*b* of connector 19. To provide shielding, ends 1 and 2 of wire 16 are connected to the shield 19*a* of the connector 19. For a tap with a 850 Mhz center frequency, the lengths of wires 16, 17, and 18 can be 2.0 inches, 1.25 inches, and 1.25 inches, respectively.

As mentioned above, wires 16, 17, and 18 may be configured as a twisted wire. Twisting is advantageous because it holds the wires in close proximity to each other. Twisting also has the advantage of minimizing coupling between the twisted wire and adjacent circuitry. Twisted wires are composed typically of inexpensive and readily available materials, such as copper.

Wires 16, 17, and 18 may also be wound around a ferrite or powdered iron bead or torroid. Using coupled wires wound about a core allows shorter coils to operate at lower frequencies.

The windings shown in FIG. 1*a* are configured for what normally would be a 6 dB coupler. However, the actual coupling of the tap is 10 dB. For example, a coupler designed for a 6 db coupling at 800 MHz was used. In this tap, the cross-coupled coupler provided about a 10 dB coupled output at 670 MHz, with 450 MHz 1 dB bandwidth.

For the purpose of attaching the tap to another cable and completing the coupling of the extracted energy from the host cable 12 to a second cable, output connector 19 is connected to the coupler 15 by attaching end 4 of wire 17 to the inner conductor 19*b* of connector 19 and connecting both ends 1 and 2 of wire 16 to the shield 19*a* of connector 19. Connector 19 is preferably adapted for use with RF cables.

When the second coaxial cable is connected to connector 19, the outer conductor of the second cable is electrically coupled to the shield 19*a* of connector 19 and the inner conductor of the second cable is electrically coupled to the inner conductor 19*b* of connector 19.

A capacitor 22 can be electrically coupled between probe 11 and coupler 15 in order that undesired signals in the host cable 12 will not be disturbed by the tap. By choosing a capacitor 22 with a self-resonance frequency, dc current is not passed while RF signals are passed at the self-resonance frequency. Intermodulation products are also low.

As mentioned above, a second coaxial cable can be attached to connector 19. Of course, any form of coupled transmission lines, including microstrip transmission lines, lumped element equivalent transmission lines, or multiple transmission lines, could be used. In addition, the match at the second coaxial cable could be improved by resistive or other matching means.

The tap described in FIG. 1*a* will extract from 50 percent to 1 percent of the energy from a host coaxial cable 12 while adding a minimum line loss to the host. This tap can be configured to operate at frequencies exceeding 4 GHz while maintaining a usable band width of +/−50 percent of the center frequency. The trifilar coupler of FIG. 1*a* represents one possible configuration of a multifilar coupler system. Other configurations of coupler 15 not using the trifilar transformer are possible. See, e.g. the embodiments of FIGS. 2 and 3. For example, an 8 dB tap with a built-in pad for enhanced return loss would yield the same results as the 10 db tap previously discussed.

The tap described above results in low losses and operates across a wide frequency band. It provides a broadband input impedance that allows it to be used in 30 to 150 ohm coaxial systems. The single hole used by the system is simple and economical to use. The tap also generates very low intermodulation products when nonlinear components are not used. The tap (as well as those described below) makes possible couplings from 3 dB to over 20 dB while maintaining the same or wider bandwidth. The tap presented minimum degradation of performance while maintaining uniform coupling over a broad bandwidth.

The tap shown in FIG. 1*a* does not employ dc coupling between the outer conductor 12*c* of the host cable 12 and the shield 19*a* of the connector 19. Rather, it is believed that the outer conductor 12*c* of the host cable 12 and the shield 19*a* of the connector 19 may be capacitively coupled.

Figure 1B:
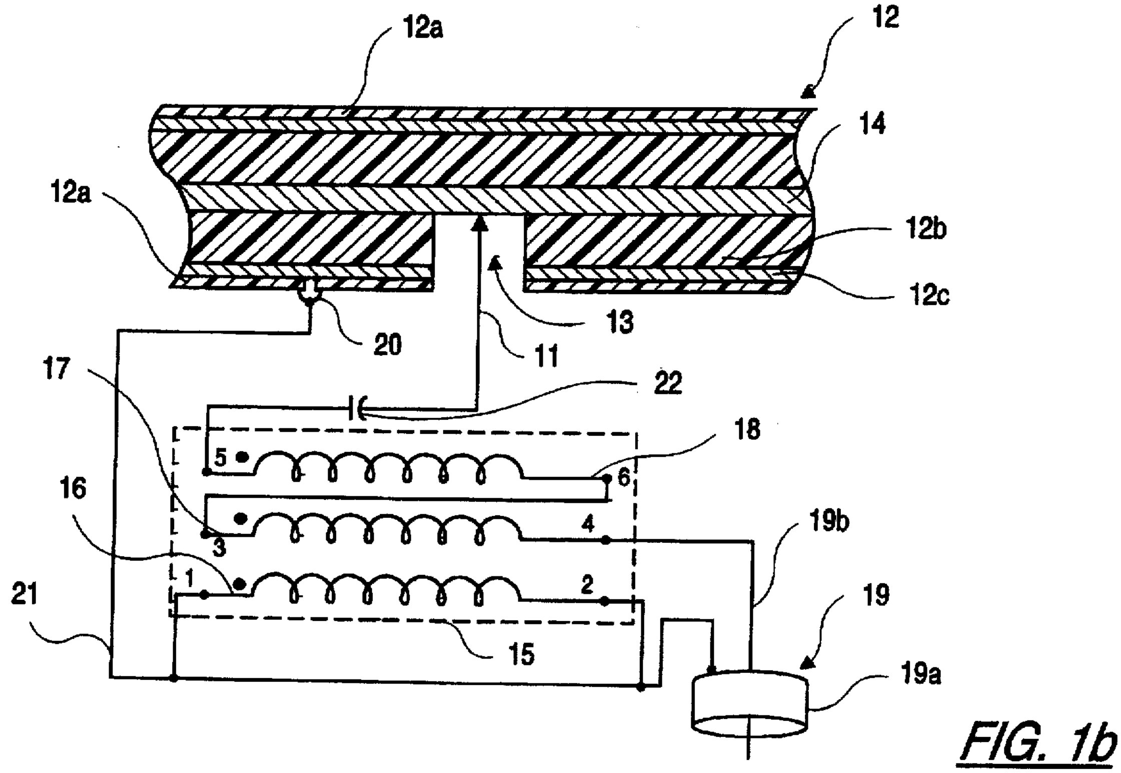
FIG. 1*b* is a schematic diagram of a tap according to the principles of the invention.

FIG. 1*b* illustrates a tap similar to that of FIG. 1*a* but having dc coupling between the outer conductor 12*c* of the host cable 12 and the shield 19*a* of the connector 19. As shown, a wire 21 is electrically coupled between the shield 19*a* of the connector 19 and the outer conductor 12*c* of the host cable 12, for example, via a self-tapping screw 20 that makes electrical contact with the outer conductor 12*c*.

Figure 1C:
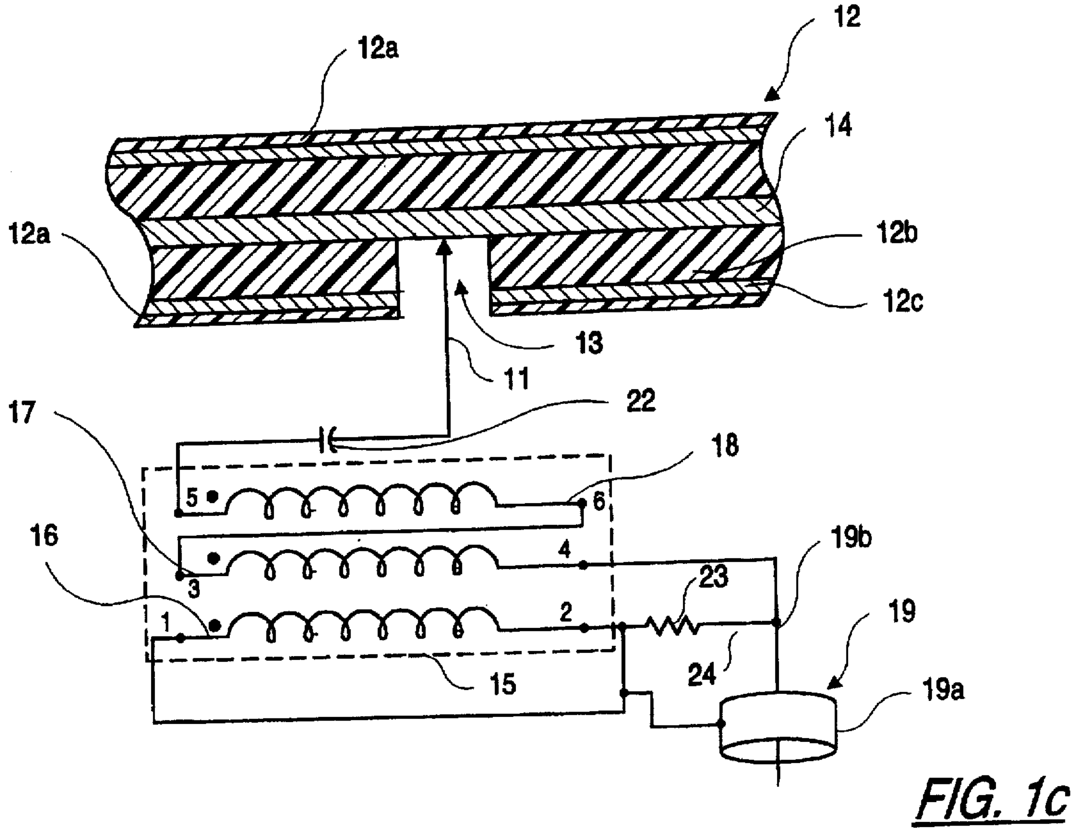
FIG. 1*c* is a schematic diagram of a tap according to the principles of the invention.

FIG. 1*c* shows a resistor 23 connected between the shield 19*a* of connector 19 (electrically, at end 1) and the inner conductor 19*b* of connector 19 (electrically, at end 4). The resistor 23, having, for example, a value of 270 ohms, may be used as illustrated in FIG. 1*c*. However, in alternative embodiments such as FIGS. 1*a* and 1*b*, the resistor may be omitted. The resistor 23 is used to increase the return loss of the tap port by lowering the output impedance of the connector. For example, proper sizing of this resistor can result in return losses of over 10 dB.

Figure 1D:
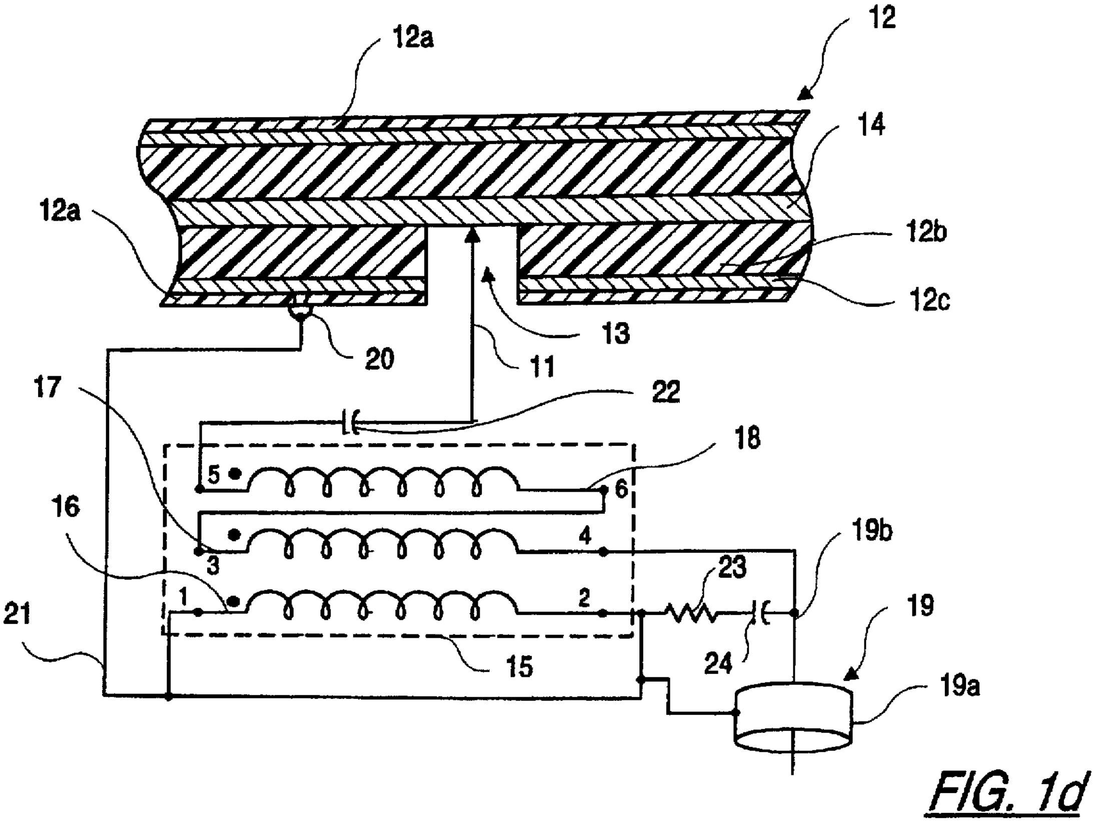
FIG. 1*d* is a schematic diagram of a tap according to the principles of the invention.

FIG. 1*d* shows an embodiment employing dc coupling and a resistor 23. Capacitor 24 is electrically coupled to resistor 23 to block dc current which might damage resistor 23.

Figure 2:
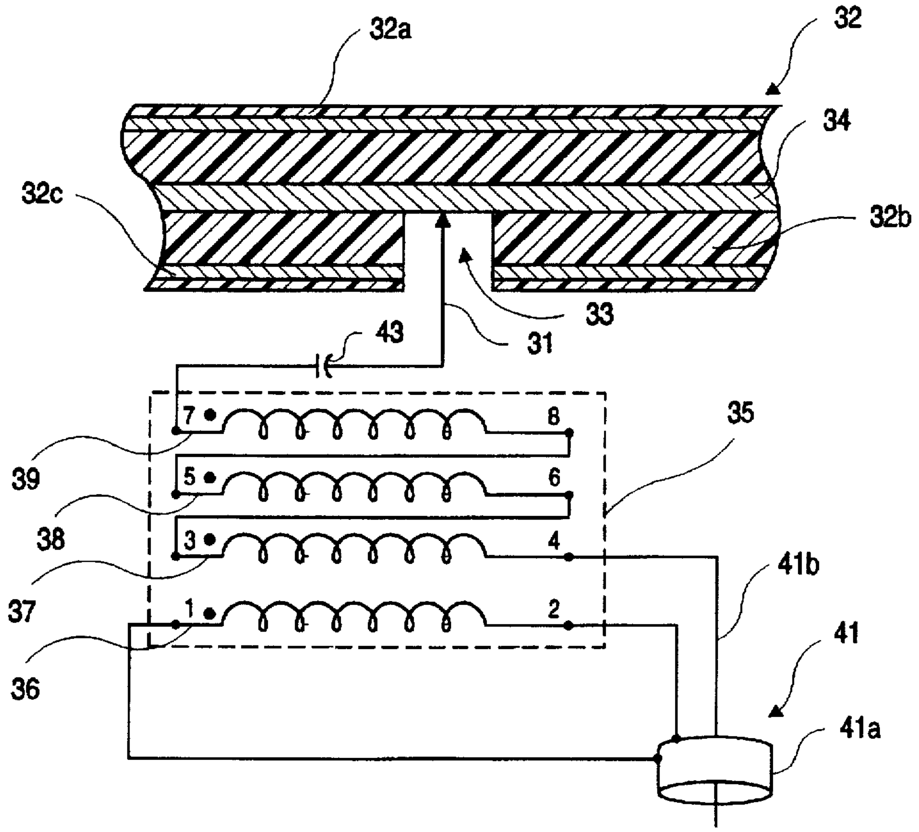
FIG. 2 is a schematic diagram of a tap according to principles of the invention.

FIG. 2 shows a tap for coupling electromagnetic energy between coaxial cable transmission lines. A hole 33 is drilled through the outer jacket 32*a*, outer conductor 32*c*, and dielectric 32*b* of a host coaxial feeder cable 32 to a central conductor 34. The hole 33 is drilled such that the hole exposes the central conductor 34. Penetration into the central conductor 34 when the hole is drilled is preferably minimal.

For the purpose of extracting electromagnetic energy from the central conductor and conducting this energy into the tap, a probe 31 is placed in the hole 33. Preferably, the probe 31 is spring loaded to bias the probe 31 into engagement with the central conductor 34. Insulating material, such as heat shrink tubing (not illustrated), can be placed over the probe 31, to prevent the probe 31 from contacting the outer conductor 32*c* of cable 32.

In order to couple the extracted energy to an output connector 41, a coupler 35 is attached between the probe 31 and the output connector 41. Preferably, the coupler comprises a length of twisted wire. The coupler then operates as a transmission line with a center frequency which is a function of the length of the twisted wire.

Specifically, a first wire 36 with ends 1 and 2 within coupler 35 shields the tap by having both its ends 1 and 2 connected to the shield 41*a* of the connector 41 as shown in FIG. 2. Wires 37, 38, and 39 within coupler 35 comprise coupled transmission lines and are cross-connected to each other as shown in FIG. 2. As shown, end 7 of wire 39 is connected to an isolation capacitor 43 which is then connected to probe 31. Alternatively, the capacitor may be omitted and end 7 may be connected directly to probe 31. End 8 of wire 39 is cross-coupled to end 5 of wire 38. End 6 of wire 38 is cross-coupled to end 3 of wire 37. Finally, end 4 of wire 37 is connected to the inner conductor 41*b* of the connector 41.

As mentioned above, wires 36, 37, 38, and 39 may be configured as a twisted wire. Twisting is advantageous because it holds the wires in close proximity to each other. Twisting also has the advantage of minimizing coupling between the twisted wire and adjacent circuitry. Twisted wires are composed typically of inexpensive and readily available materials, such as copper.

As shown in FIG. 2, wires 36, 37, 38, and 39 are wound wires and are configured for a 20 dB tap. These wires may be wound around a ferrite or powdered iron bead or torroid. The additional wire gives this tap a higher dB rating as compared with the taps of FIGS. 1*a* or 1*b*. Coupled wires wound about a core allows shorter coils to operate at lower frequencies.

For the purpose of attaching the tap to another cable and completing the coupling of the extracted energy from the host cable 32 to a second cable, the output connector 41 is connected to the coupler 35 as shown. Connector 41 is preferably adapted for use with RF cables.

As mentioned above, a second coaxial cable can be attached to connector 41. Of course, any form of coupled transmission lines, including microstrip transmission lines, lumped element equivalent transmission lines, or multiple transmission lines, could be used. In addition, the match at the second coaxial cable could be improved by resistive or other matching means.

The tap described above results in low losses and operates across a wide frequency band. It provides a broadband input impedance that allows it to be used in 30 to 150 ohm coaxial systems. The single hole used by the system is simple and economical to use. The tap also generates very low intermodulation products when nonlinear components are not used.

Figure 3:
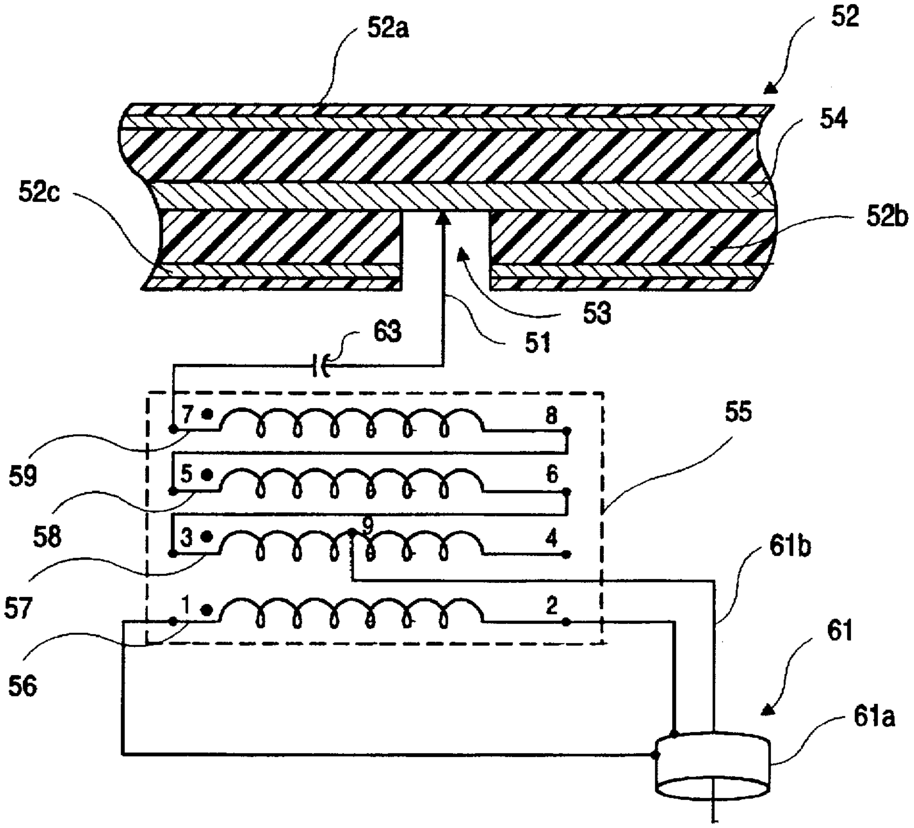
FIG. 3 is a schematic diagram of a tap according to principles of the invention.

The tap configuration of FIG. 3 is similar to that of FIG. 2. A probe 51 is inserted into a hole 53 drilled through the outer jacket 52*a*, outer conductor 52*c*, and dielectric 52*b* of cable 52 to contact the central conductor 54. Energy flows through probe 51, capacitor 63, and into coupler 55. The coupler 55 comprises wires 56, 57, 58, and 59 which function as described above in connection with FIG. 2. Connector 61 also functions as described above in connection with FIG. 2. However, the inner conductor 61*b* of the connector 61 is connected at point 9 of wire 57. This connection results in a 15 dB tap, rather than the 20 dB tap of FIG. 2. As shown, end 7 of wire 59 is connected to capacitor 63. End 8 of wire 59 is cross-coupled to end 5 of wire 58. End 6 of wire 58 is cross-coupled to end 3 of wire 57. End 4 is left unconnected or connected to ground. To provide for shielding, ends 1 and 2 of wire 56 are connected to the shield 61*a* of the connector 61.

The tap of FIG. 3 results in low losses and operates across a wide frequency band. It provides a broadband input impedance that allows it to be used in 30 to 150 ohm coaxial systems. The single hole used by the system is simple and economical to use. The tap also generates very low intermodulation products when nonlinear components are not used.

The tap described in FIG. 3 also extracts from 50 percent to 1 percent of the energy from a host coaxial cable while adding a minimum line loss to the host. This tap can be configured to operate at frequencies exceeding 4 Ghz while maintaining a usable band width of +/31 50 percent of the center frequency. Other configurations of coupler 55 not using the multifilar transformer are possible.

Figure 4A:
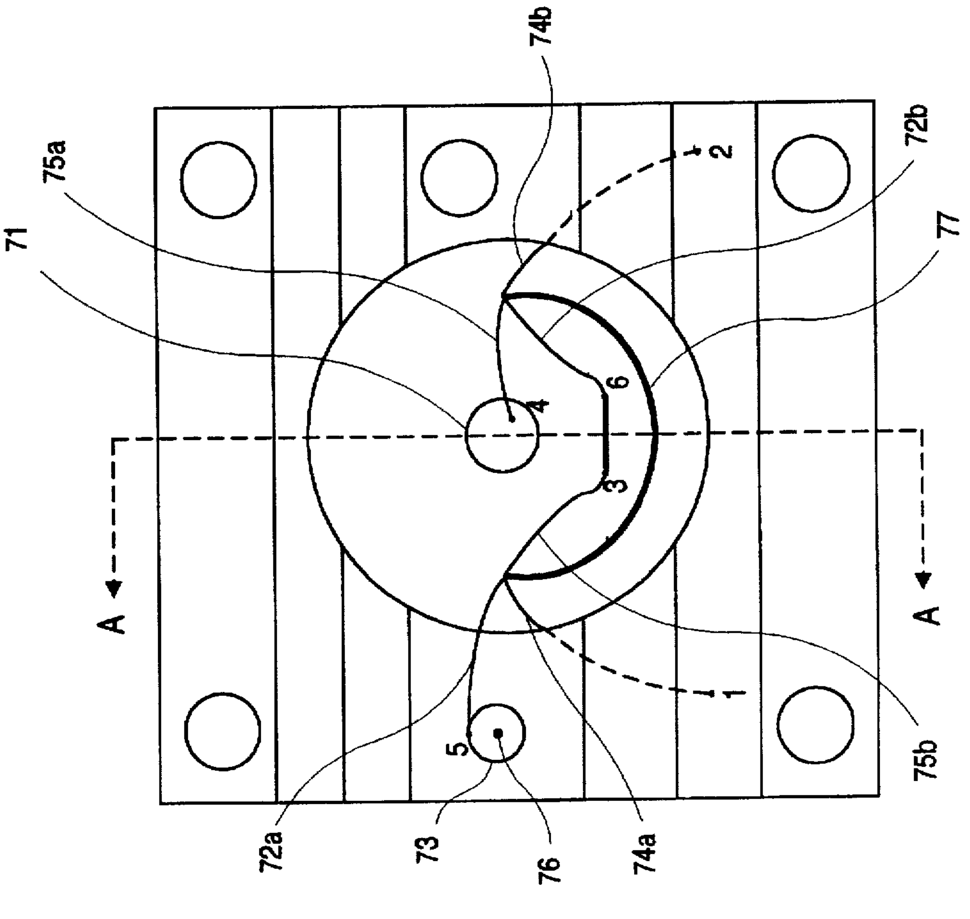
FIG. 4*a* shows a top of the tap assembly according to principles of the invention.

FIG. 4*a* shows a top view of the assembly for the tap described above in reference to FIG. 1*a*. The wire used to construct the coupler may be, for example, No. 34 SNR wire. Wire segment 74*a* represents part of a shielding wire 16 (of FIG. 1*a*) with end 1. Wire segment 74*b* represents another part of the shielding wire 16 with end 2. Wire segment 72*a* is part of coupling wire 18 with end 5. Wire segment 72*b* represents another part of coupling wire 18 with end 6. Wire segment 75*a* is one segment of the other coupling wire 17 with end 4. Wire segment 75*b* is another segment of the coupling wire 17 and has end 3. End 5 is attached to the probe at port 73 while end 4 attaches one end of the coupler to the inner conductor 71 of the connector. Ends 3 and 6 are electrically joined, for example, using lap solder techniques.

The three wires are twisted into coil 77. The three wires used to construct coil 77 may be three strands of No. 34 wire. The wire used may also be manufactured twisted wire such as twist-type wire, available from MWS Wire Industries, Westlake Village, Calif. The number of twists in coil 77 may vary, for example, between six and twelve including, for example, 6, 7, or 8 twists.

Figure 4B:
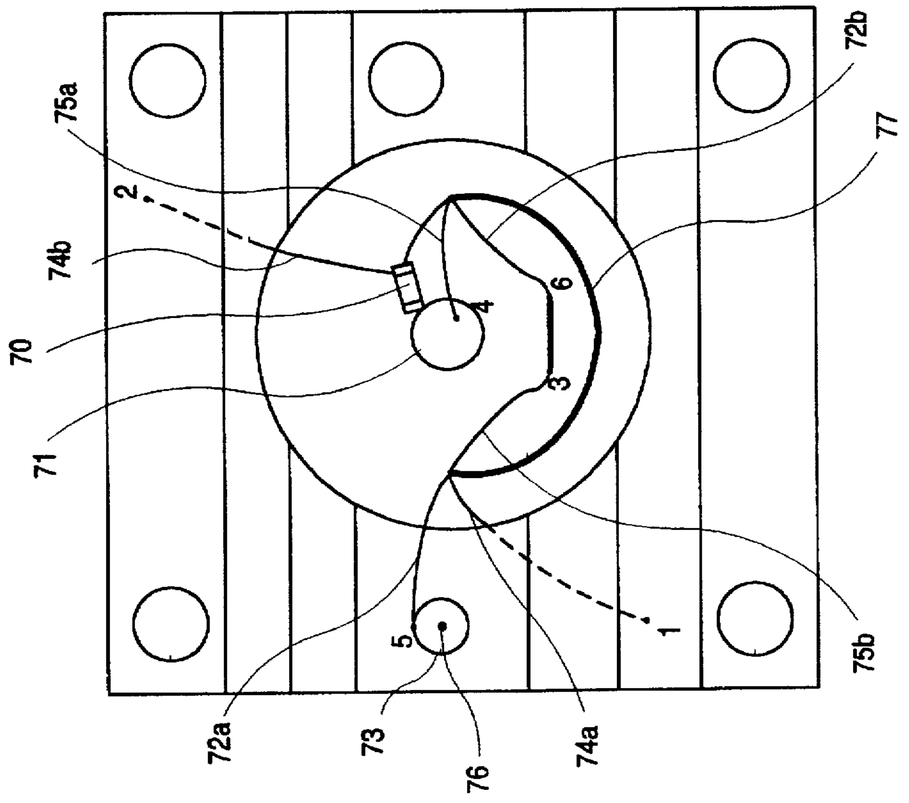
FIG. 4*b* shows a top view of the tap assembly according to principles of the invention.

FIG. 4*b* shows a tap identical to the tap of FIG. 4*a* except a resistor 70 has been electrically coupled between wire segment 74*b* and the inner conductor 71 of the connector. Connecting the resistor between these points puts a resistance between the inner conductor 71 and shield of the connector and accordingly between the inner conductor and shield of the second cable.

Figure 4C:
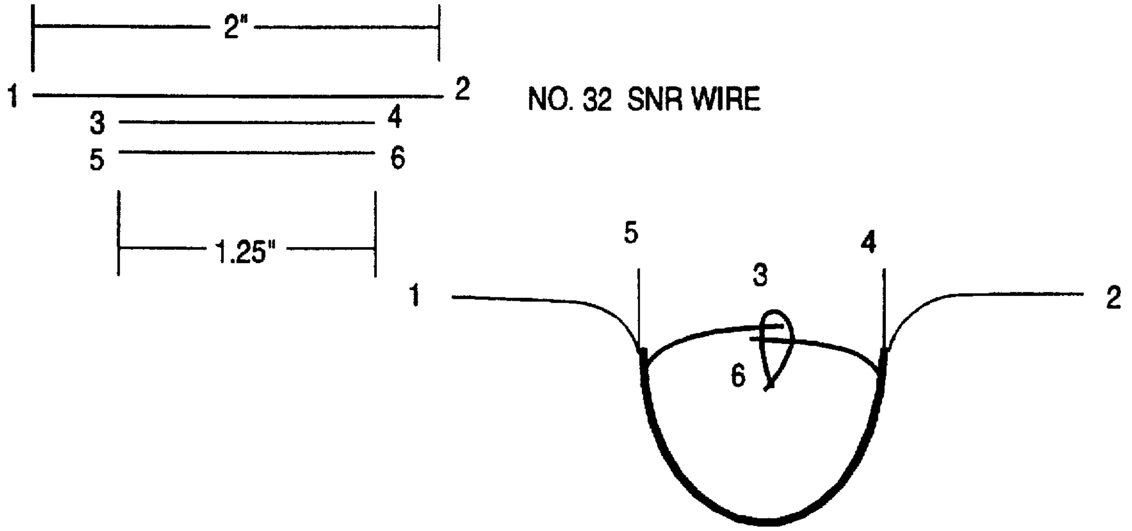
FIG. 4*c* shows details of the coil structure according to principles of the invention.

FIG. 4*c* shows the details of the coil assembly 77 of FIGS. 4*a* and 4*b* with ends 3 and 6 connected with, for example, lap soldering techniques.

Figure 5A:
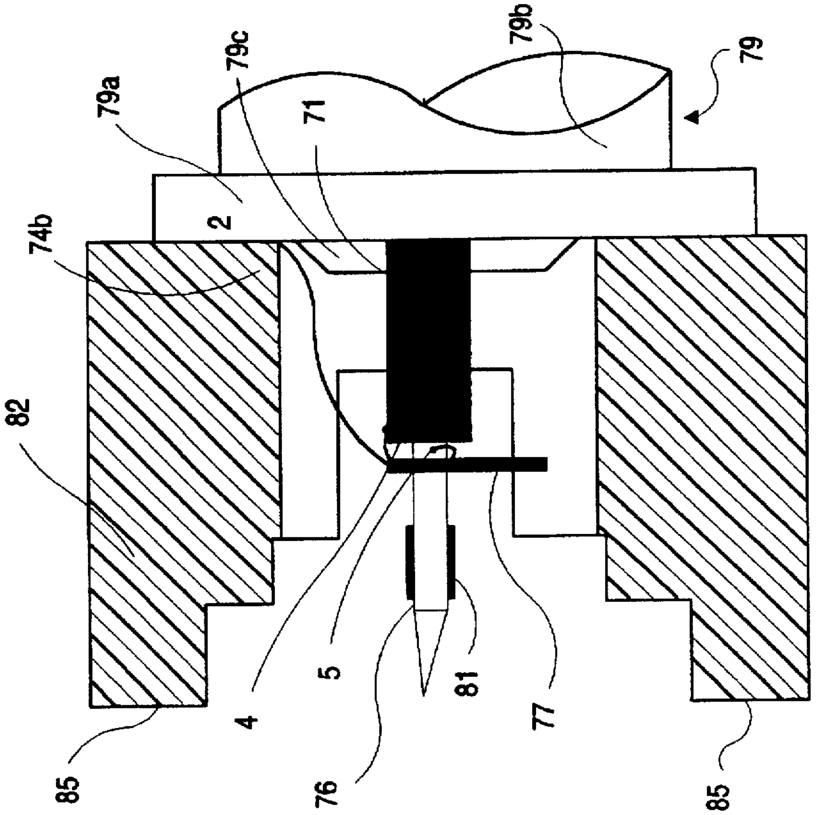
FIG. 5*a* shows a cross-sectional view of the tap assembly of FIG. 4 according to principles of the invention.

FIG. 5*a* shows a cross-sectional view of the assembly of FIG. 4*a* along line A—A. As shown, probe 76 is housed in an outer plastic body 82. The body 82 may be constructed of 6/6 nylon, for example. Ends 1 and 2 are attached to the shield of the second cable by conductive epoxy. Probe 76 is preferably a spring probe such as a SOB302.5G 0.660 inch probe available from Interconnect Devices Inc., Kansas City, Kans. If a spring pin is used as a probe 76, care should be taken that the base of the spring pin is not in contact with the connector. The RF connector 79 shown in FIG. 5*a* is an type "N" connector and consists of a flange connector 79*a* and circular portion 79*b*. Although an "N" type is illustrated, any connector capable of conducting RF signals can be used. End 4 of coupling wire 75*a* is electrically coupled to the center conductor 71 of the connector 79 while end 5 of a coupler wire 72*a* is electrically coupled to the probe 76. Ends 1 and 2 of the shielding wire are connected to the shield of connector 79 via the connector flange 79*a*. Ends 1 and 2 may be connected to the shield of the connector 79 by sandwiching these ends between the housing 82 and the connector flange 79*a*. The flange 79*a* is connected to a connector support portion 79*b*. Alternatively, ends 1 and 2 may be connected to connector portion 79*c*.

Figure 6C:
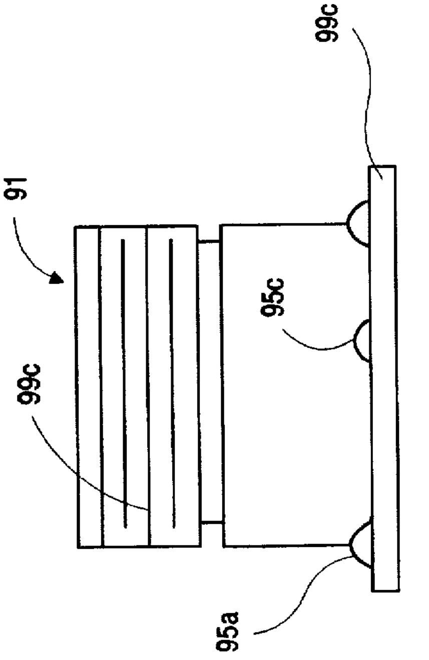
FIG. 6*c* shows a view of a connector according to principles of the invention.
Figure 6B:
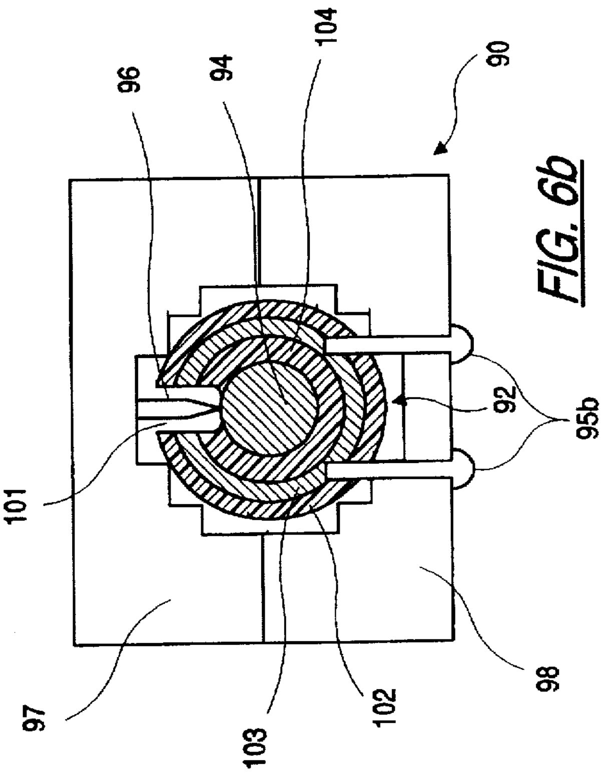
FIG. 6*b* shows an end cross-sectional view of the tap assembly of FIG. 6*a* showing the interior of the assembly according to principles of the invention.

A housing surrounds the host cable. As will be described below (see FIG. 6*b*), the housing actually consists of two parts to form a clamp, a first part (illustrated in FIG. 5*a*) and a second part which connects to left surface 85 and which fits around the host cable and clamps the host cable between the two housing parts.

The taps presented in FIGS. 4*a*, 4*b*, and 5*a* and 5*b* operate with 30 ohm to 150 ohm systems. As described above, probe 76 is spring-loaded as a convenient method of insuring continuous contact to the host cable center conductor. The impedance of the connector and host cable is of no consequence. A piece of heat shrink tubing 81 can be placed over the probe 76 as a matter of assembly convenience to prevent contact of the probe 76 with the host cable outer conductor.

Figure 5B:
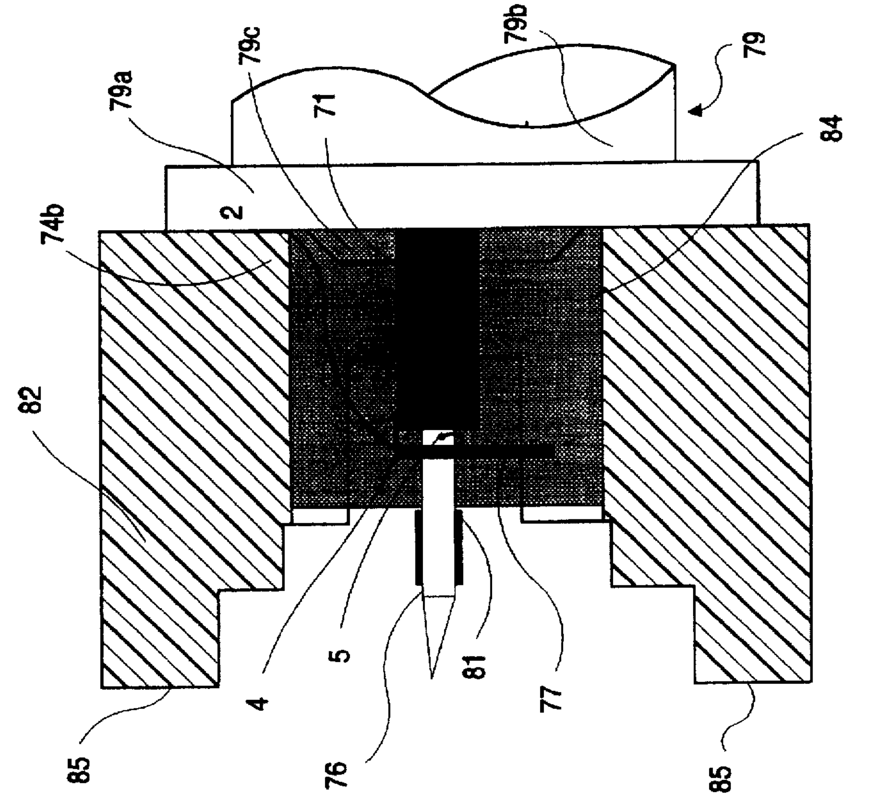
FIG. 5*b* shows a cross-sectional view of the tap assembly of FIG. 4 according to principles of the invention.

FIG. 5*b* shows the embodiment of FIG. 5*a* except that a non-conductive potting compound 84 has been added to prevent movement of the internal parts.

Figure 6A:
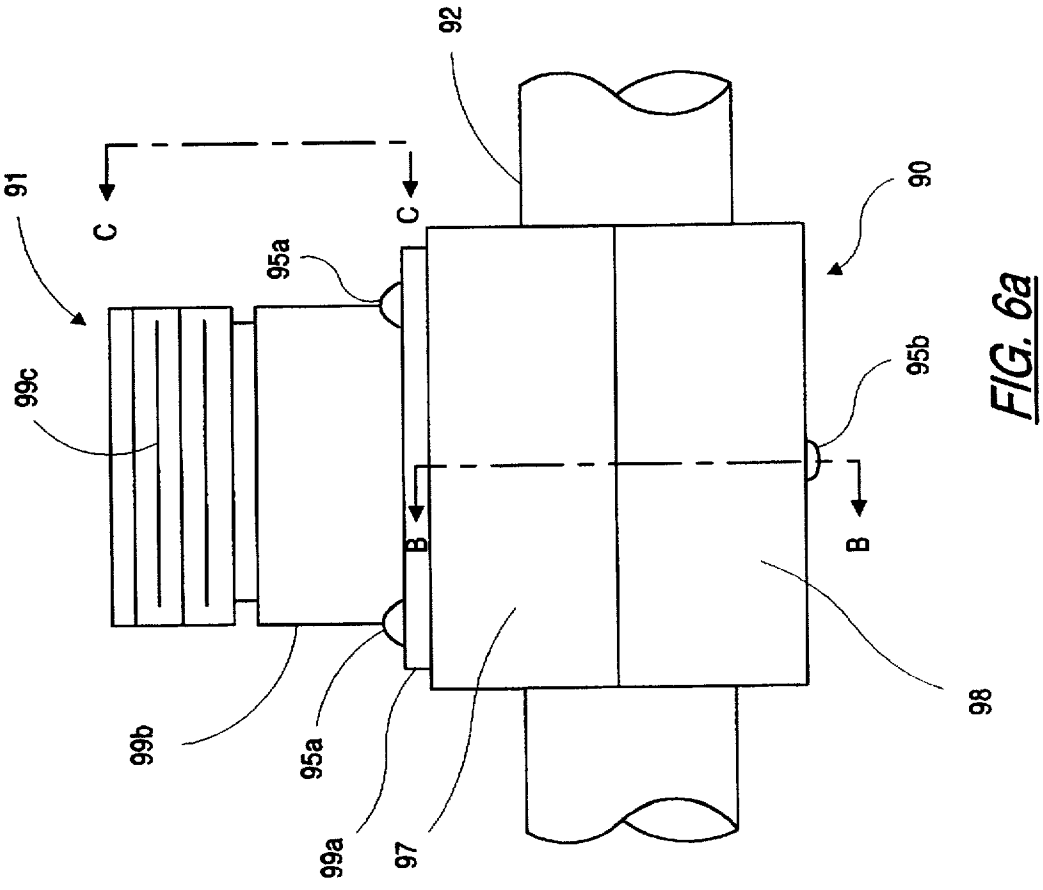
FIG. 6*a* is a side view of a tap assembly according to principles of the invention.

FIG. 6*a* depicts the outer body of tap assembly 90 connected to cable 92. As shown, the tap assembly 90 comprises an upper part 97 and a lower part 98. Parts 97 and 98 are adapted to fit over opposite sides of cable 92 to clamp cable 92 between the top part 97 and bottom part 98 of the housing.

Screws 95*a* are placed through connector flange 99*a* to attach the connector 91 to the tap assembly 90. These screws are preferably #4×1" self tap screws and may penetrate through top part 97 into bottom part 98 to attach the two parts. Screw threads 99*c* of the connector 91 permit the connector 91 to attach to a second cable. Support portion **99*b* separates threads 99*c* and flange 99*a***.

FIG. **6*b* is a cross-sectional view of the assembly of FIG. 6*a* along line B—B showing how a probe 96 contacts the central conductor 94 of the host cable 92. The probe 96 is placed in hole 101 which is drilled through the outer jacket 102, outer conductor 103, and dielectric 104 of the host cable 92. The tap assembly 90 consists of an upper part 97 and a lower part 98. Parts 97 and 98 are adapted to fit over opposite sides of cable 92 and to clamp the cable 92 between the top part 97 and the bottom part 98 of the housing. Probe 96 is mounted on one of the two parts 97 or 98 of the housing so that the clamping of the two parts against the cable 92 holds probe 96 against the central conductor 94 of the cable 92. DC coupling, as discussed with reference to FIG. 1*b*, if required, is accomplished by using screw 95*c* (see FIG. 6*c*) to electrically join the host cable outer conductor 103 to the outer conductor of the second cable. Screw 95*c* may be a self-tapping screw that penetrates outer jacket 102 and electrically connects outer conductor 103**.

Screws **95*b* preferably are screwed through the bottom of assembly 90 to prevent the cable inside the assembly from rotating. Screws 95*b* are preferably #4×⅝" self tap screws. The screws 95*b* completely penetrate the jacket 102 and penetrate preferably one-eighth inch into the outer conductor 103 of the cable 92**.

FIG. **6*c* shows another view of the connector 91 along line C—C of FIG. 6*a*. Screws 95*a* attach connector 91 to tap assembly 90. Screw 95*c* electrically couples the shield of the connector 91 and the outer conductor of the host cable 92**.

The tap assemblies depicted in FIGS. 5, **6*a*, and 6*b*** can be adapted to attach to coaxial cables of a variety of sizes including, for example, cables above three inches in diameter. Furthermore, these assemblies are rugged, suitable for a wide range of applications, and do not require a splice. The assemblies are also easy and inexpensive to manufacture since they contain a minimum number of parts.

Figure 7A:
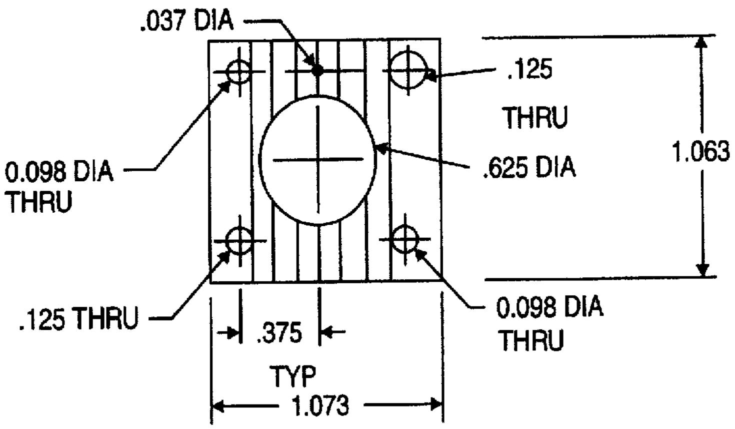
FIG. 7*a* shows a top view of the case assembly according to the present invention.
Figure 7B:
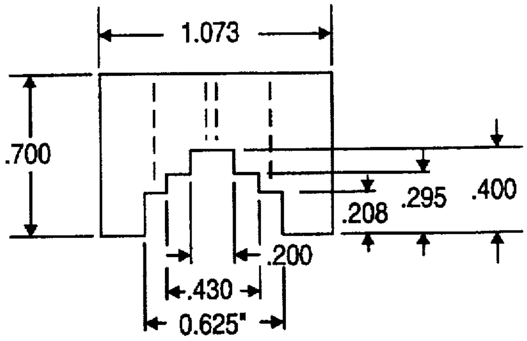
FIGS. 7*b* and 7*c* show side views of the case assembly according to principles of the present invention.
Figure 7C:
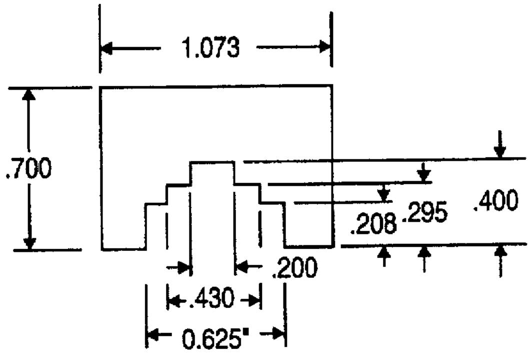
Figure 7D:
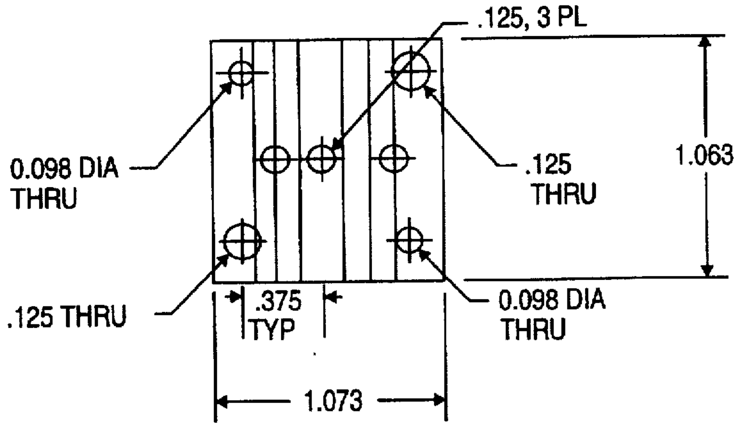
FIG. 7*d* shows a bottom view of the case assembly according to the present invention.

The dimensions of the tap assembly housing for one embodiment of the invention are illustrated in FIGS. **7*a*–7*d* wherein FIG. 7*a* is a top view, FIGS. 7*b* and 7*c* are side views, and FIG. 7*d*** is a bottom view.

While the present invention has been described with reference to one or more particular embodiments, those skilled in the art will recognize that many changes may be made thereto without departing from the spirit and scope of the present invention, which is set forth in the following claims.

We claim:

1. A coaxial tap for coupling electromagnetic energy between first and second coaxial cables, said tap comprising:
   - a probe extending through the outer conductor of the first cable into contact with the inner conductor of the first cable,
   - a pair of electromagnetically coupled windings connecting the probe with the inner conductor of the second cable for coupling electromagnetic signals between the first and second cables, and
   - a shielding winding wherein said shielding winding and said pair of coupling windings are formed by a trifilar wire in which one wire is used as said shielding winding and the other two wires are used as said coupling windings.

2. A tapping system for coupling electromagnetic energy between first and second coaxial cables, said tapping system comprising:
   - a pair of coupled transmission lines;
   - means for connecting said transmission lines to said first cable;
   - means for connecting said transmission lines to said second cable; and
   - wherein said pair of coupled transmission lines comprise twisted wire.

3. A tapping system for coupling electromagnetic energy between first and second coaxial cables, said tapping system comprising:
   - a pair of coupled transmission lines;
   - means for connecting said transmission lines to said first cable;
   - means for connecting said transmission lines to said second cable; and
   - wherein said pair of coupled transmission lines are comprised of two wires of a trifilar twisted wire, the third wire of said trifilar twisted wire comprising a shield.

4. A coaxial tap for coupling electromagnetic energy between first and second coaxial cables, said tap comprising:
   - a probe extending through the outer conductor of the first cable into contact with the inner conductor of the first cable,
   - a pair of electromagnetically coupled windings connecting the probe with the inner conductor of the second cable for coupling electromagnetic signals between the first and second cables, and
   - a housing comprising two parts having non-circular cross-sections adapted to fit over opposite sides of the first cable to clamp the first cable between the two parts of the housing, said probe being mounted on one of the two parts of the housing so that the clamping of the two parts against the first cable holds the probe against the inner conductor of the first cable.

5. A coaxial tap for coupling electromagnetic energy between first and second coaxial cables, said tap comprising:
   - a probe extending through the outer conductor of the first cable into contact with the inner conductor of the first cable,
   - a pair of electromagnetically coupled windings connecting the probe with the inner conductor of the second cable for coupling electromagnetic signals between the first and second cables, and
   - wherein the length of said pair of coupling windings is selected to provide a desired center frequency for the signal to be coupled between the first and second cables.

6. A coaxial tap for coupling electromagnetic energy between first and second coaxial cables, said tap comprising:
   - a probe extending through the outer conductor of the first cable into contact with the inner conductor of the first cable,
   - a pair of electromagnetically coupled windings connecting the probe with the inner conductor of the second cable for coupling electromagnetic signals between the first and second cables, and
   - wherein said pair of coupled windings are connected in series with each other between the probe and the inner conductor of the second cable.

7. A tapping system for coupling electromagnetic energy between first and second coaxial cables said tapping system comprising:
   - a pair of coupled transmission lines;
   - means for connecting said transmission lines to said first cable;

means for connecting said transmission lines to said second cable; and wherein the center frequency of operation is set by the length of said coupled transmission lines.

8. A coaxial tap for coupling electromagnetic energy between first and second coaxial cables, said tap comprising:

a probe extending through the outer conductor of the first cable into contact with the inner conductor of the first cable, a pair of electromagnetically coupled windings connecting the probe with the inner conductor of the second cable for coupling electromagnetic signals between the first and second cables, and a third coupled winding electromagnetically coupled to said pair of coupled windings wherein the three coupled windings are connected in series with each other between the probe and the inner conductor of the second cable.

9. A tapping system for coupling electromagnetic energy between first and second coaxial cables, said tapping system comprising:

a pair of coupled transmission lines;

means for connecting said transmission lines to said first cable;

means for connecting said transmission lines to said second cable; and wherein said pair of transmission lines present a high direct current impedance to said first coaxial cable and further comprising a D.C.-isolating capacitor connected between the pair of transmission lines and the probe, said capacitor providing a self-resonant frequency.

10. A coaxial tap for coupling electromagnetic energy between first and second coaxial cables, said tap comprising:

a probe extending through the outer conductor of the first cable into contact with the inner conductor of the first cable, a pair of electromagnetically coupled windings connecting the probe with the inner conductor of the second cable for coupling electromagnetic signals between the first and second cables, and a third coupling winding electromagnetically coupled to said pair of coupling windings wherein the three coupling windings are connected in series with each other and the probe, the coupling winding farthest from the probe being connected to the inner conductor of the second cable by a center tap on that winding.

11. A coaxial tap for coupling electromagnetic energy between first and second coaxial cables, said tap comprising:

a probe extending through the outer conductor of the first cable into contact with the inner conductor of the first cable, a pair of electromagnetically coupled windings connecting the probe with the inner conductor of the second cable for coupling electromagnetic signals between the first and second cables, and a D.C.-isolating capacitor connected between the pair of coupling windings and the probe, said capacitor providing a self-resonant frequency.

12. A coaxial tap for coupling electromagnetic energy between first and second coaxial cables, said tap comprising:

a probe extending through the outer conductor of the first cable into contact with the inner conductor of the first cable, a pair of electromagnetically coupled windings connecting the probe with the inner conductor of the second cable for coupling electromagnetic signals between the first and second cables, and wherein the impedance match of said second coaxial cable is improved by inserting a lossy element between the pair of coupled windings and said second coaxial cable.

13. A coaxial tap for coupling electromagnetic energy between first and second coaxial cables, said tap comprising:

a probe extending through the outer conductor of the first cable into contact with the inner conductor of the first cable, a pair of electromagnetically coupled windings connecting the probe with the inner conductor of the second cable for coupling electromagnetic signals between the first and second cables, and a shielding winding connecting the outer conductors of the first and second cables and electromagnetically coupled to said pair of coupling windings for shielding the coupling windings.

14. The coaxial tap of claim 13 wherein said probe is spring-loaded to bias the probe into engagement with the inner conductor of the first cable.

15. The coaxial tap of claim 13 wherein said shielding winding and said pair of coupling windings are formed by a trifilar wire in which one wire is used as said shielding winding and the other two wires are used as said coupling windings.

16. The coaxial tap of claim 13 which includes a housing containing a coaxial connector adapted to be connected to the second cable, the outer conductor of said connector forming part of the outer conductor of the second cable, and the inner conductor of said connector forming part of the inner conductor of the second cable.

17. The coaxial tap of claim 13 which includes a housing comprising two parts adapted to fit over opposite sides of the first cable to clamp the first cable between the two parts of the housing, said probe being mounted on one of the two parts of the housing so that the clamping of the two parts against the first cable holds the probe against the inner conductor of the first cable.

18. The coaxial tap of claim 13 wherein the length of said pair of coupling windings is selected to provide a desired center frequency for the signal to be coupled between the first and second cables.

19. The coaxial tap of claim 13 which includes insulating means for insulating said probe from the outer conductor of the first cable.

20. The coaxial tap of claim 13 wherein said pair of coupling windings are connected in series with each other between the probe and the inner conductor of the second cable.

21. The coaxial tap of claim 13 which includes a third coupling winding electromagnetically coupled to said pair of coupling windings wherein the three coupling windings are connected in series with each other between the probe and the inner conductor of the second cable.

22. The coaxial tap of claim 13 which includes a third coupling winding electromagnetically coupled to said pair of coupling windings wherein the three coupling windings are connected in series with each other and the probe, the coupling winding farthest from the probe being connected to the inner conductor of the second cable by a center tap on that winding.

23. The coaxial tap of claim 13 which includes a D.C.-isolating capacitor connected between the pair of coupling windings and the probe.

24. The coaxial tap of claim 13 wherein the impedance match of said second coaxial cable is improved by inserting a lossy element between the pair of coupled windings and said second coaxial cable.

25. A coaxial tap for coupling electromagnetic energy between first and second coaxial cables, said tap comprising:

a probe extending through the outer conductor of the first cable into contact with the inner conductor of the first cable, said probe being spring-loaded to bias the probe into engagement with the inner conductor of the first cable;

a pair of electromagnetically coupled windings connecting the probe with the inner conductor of the second cable for coupling electromagnetic signals between the first and second cables, the length of said pair of coupling windings selected to provide a desired center frequency for the signal to be coupled between the first and second cables;

a shielding winding connecting the outer conductors of the first and second cables and electromagnetically coupled to said pair of coupling windings for shielding the coupling windings, wherein said shielding winding and said coupling windings are formed by a trifilar wire in which one wire is used as said shielding winding and the other two wires are used as said coupling windings; and a housing containing a coaxial connector adapted to be connected to the second cable, the outer conductor of said connector forming part of the outer conductor of the second cable, and the inner conductor of said connector forming part of the inner conductor of the second cable, said housing comprising two parts adapted to fit over opposite sides of the first cable to clamp the first cable between the two parts of the housing, said probe being mounted on one of the two parts of the housing so that the clamping of the two parts against the first cable holds the probe against the inner conductor of the first cable.

* * * * *